(12) United States Patent
Hirotsu et al.

(10) Patent No.: US 7,057,239 B2
(45) Date of Patent: Jun. 6, 2006

(54) SEMICONDUCTOR DEVICE ALLOWING MODULATION OF A GAIN COEFFICIENT AND A LOGIC CIRCUIT PROVIDED WITH THE SAME

(75) Inventors: Fusayoshi Hirotsu, Fukuoka (JP); Junichi Hirotsu, Kitakyushu (JP)

(73) Assignee: Fusayoshi Hirotsu, Fukuoka (JP)

( * ) Notice: Subject to any disclaimer, the term of this patent is extended or adjusted under 35 U.S.C. 154(b) by 107 days.

(21) Appl. No.: 10/769,819

(22) Filed: Feb. 3, 2004

(65) Prior Publication Data
US 2004/0256676 A1 Dec. 23, 2004

(30) Foreign Application Priority Data
Jun. 19, 2003 (JP) .............................. 2003-174703

(51) Int. Cl.
*H01L 29/78* (2006.01)
*H01L 29/96* (2006.01)

(52) U.S. Cl. ...................................... 257/366; 257/368

(58) Field of Classification Search ........ 257/365–366, 257/368–369
See application file for complete search history.

(56) References Cited

U.S. PATENT DOCUMENTS 6,774,733 B1 * 8/2004 Arima ........................ 331/57
6,911,701 B1 * 6/2005 Arima ........................ 257/368
2003/0006438 A1 * 1/2003 Arima ........................ 257/288

FOREIGN PATENT DOCUMENTS

| JP | 11-251582 | * | 9/1999 |
| JP | 2002-222944 | * | 8/2002 |
| WO | WO 02/059979 A1 | | 8/2002 |

OTHER PUBLICATIONS

L. Chang et al., Gate Lenght Scaling and Threshold Voltage Control of Double-Gate MOSFETs. IEEE 2000, pp. 719-722.*
K. Kim et al., Nanoscale CMOS Circuit Leakage Power Reduction by Double-Gate Device. IEEE 2004, pp. 102-107.*

* cited by examiner

*Primary Examiner*—Anh Duy Mai
(74) *Attorney, Agent, or Firm*—Finnegan, Henderson, Farabow, Garrett & Dunner, L.L.P.

(57) ABSTRACT

In addition to ordinary MOS gate, drain and source, a semiconductor element includes a control gate having geometry, which is defined only by a group of straight lines along a rectangular form of the MOS gate, is not defined by an oblique line and provides a nonuniform gate length at least in one of regions aligned in a direction of a gate width. A channel region formed by the control gate provides a region of strong electric fields and a region of weak electric fields. Consequently, a conductance of a whole channel region formed by the MOS gate and the control gate, i.e., a gain coefficient β of the semiconductor element can be modulated in accordance with voltages applied to the MOS gate and the control gate.

20 Claims, 9 Drawing Sheets

SEMICONDUCTOR DEVICE ALLOWING MODULATION OF A GAIN COEFFICIENT AND A LOGIC CIRCUIT PROVIDED WITH THE SAME

BACKGROUND OF THE INVENTION

1. Field of the Invention

The present invention relates to a semiconductor element, and particularly to a field-effect transistor, of which gain coefficient β can be modulated in an analog manner as well as a logic circuit provided with the same.

2. Description of the Background Art

Semiconductor devices except for some special semiconductor elements have employed tri-electrode structures over about thirty years since these were invented. In a conventional semiconductor element, characteristics (gain coefficient β) depend on geometrical sizes set in a design stage, and therefore cannot be changed in a later stage. Thus, the gain coefficient β, which is a kind of unique characteristics of the semiconductor element, is fixed. Therefore, variations in characteristics due to variations in size of elements result in disadvantageous lowering of yields.

For overcoming the above, International Application Publication No. WO02/059979 has disclosed a semiconductor element, of which gain coefficient β can be modulated or determined independently of other semiconductor elements. The semiconductor element disclosed in the above International Application Publication No. WO02/059979 is provided with a control gate in addition to an ordinary MOS (Metal Oxide Semiconductor) gate. In accordance with a voltage applied to this control gate, a direction of an electric field in a channel direction is modulated to change effective gate length and gate width, and therefore, the gain coefficient β in the semiconductor element (field-effect transistor) can be modulated.

In the semiconductor element disclosed in the above International Application Publication No. WO02/059979, however, the control gate is arranged to form a certain angle θ with respect to the ordinary MOS gate for modulating the direction of the electric field at the channel. Accordingly, either the ordinary gate or the control gate does not have a geometry, which is not defined by a group including only straight and perpendicular lines, but is defined by a line group additionally including an oblique line(s) obliquely crossing the straight and perpendicular lines.

In particular, the above angle θ exerts a significant influence as a β-modulation parameter of the semiconductor element so that the oblique-line structure must be prepared with a high dimensional accuracy. This results in difficulty in gate preparation, and thus results in increases in fabrication cost and unstable production quality. More specifically, the above difficulty causes variations in characteristics of the fabricated semiconductor elements.

SUMMARY OF THE INVENTION

An object of the invention is to provide a semiconductor element having a structure, which allows modulation of a gain coefficient β and can be stably fabricated, as well as a logic circuit provided with the same.

A semiconductor element according to the invention includes a source, a drain, a first gate for forming a channel region of a uniform electric field between the source and the drain, and a second gate for forming a channel region of a nonuniform electric field formed of strong, and weak electric field regions. The first and second gates are located between the source and the drain, and overlap at least partially each other in a plan view. A conductance of the whole channel region between the source and the drain changes as a conductance of the channel region provided by the second gate changes in accordance with a voltage applied to the second gate.

Preferably, occurrence of the strong electric field region and the weak electric field region partially changes a direction of the electric field in the whole channel region formed by the first and second gates, and this change in electric field direction modulates the effective gate length and gate width in the whole channel region.

Preferably, the first gate has a rectangular form, and the second gate has geometry defined by a group of straight lines extending along the geometry of the first gate.

A semiconductor element according to another aspect of the invention includes a source, a drain, a first gate having a rectangular form for forming a channel region between the source and the drain, and a second gate for forming a channel region between the source and the drain. The second gate has geometry defined by a group of straight lines along the geometry of the first gate, and having a gate length partially variable depending on a position along the gate width. The second gate is formed in a region between the source and the drain, and overlaps at least partially with the first gate in a plan view.

Preferably, the second gate in the region between the source and the drain covers the first gate in a plan view.

Preferably, the second gate is configured to leave a portion not provided with the second gate within a region overlapping with the first gate in a plan view.

Further preferably, the second gate is not formed in a central portion, in a direction of a gate width, within the region overlapping with the first gate in a plan view, and is formed in a portion other than the central portion.

Preferably, the second gate is formed in a central portion, in a direction of a gate width, within the region overlapping with the first gate in a plan view, and is not formed in a portion other than the central portion.

Further preferably, a conductance of a whole channel region including channels respectively formed by the first and second gates is controlled in accordance with voltages applied to the first and second gates.

Preferably, an electric field vector in a whole channel region formed by the first and second gates is modulated in accordance with a ratio between voltages applied to the first and second gates, respectively.

Preferably, the first and second gates are layered with an insulating layer interposed between the first and second gates for electrical isolation.

Preferably, geometry of the first and second gates are designed such that the channel regions respectively formed by the first and second gates between the source and the drain have geometrical continuity.

Preferably, in the region between the source and the drain, a first portion overlapping with the first gate in a plan view has an impurity concentration different from that of a second portion not including the first portion but overlapping with the second gate in a plan view.

Preferably, in the region between the source and the drain, a first portion overlapping with the first gate in a plan view has an impurity concentration substantially equal to that of a second portion not including the first portion and overlapping with the second gate in a plan view.

A logic circuit according to the invention includes first and second field-effect transistors connected in series between nodes respectively supplying first and second voltages, and having a first conductivity type and a conductivity type opposite to the first conductivity type, respectively. Each of the first and second field-effect transistors includes a source, a drain, a rectangular first gate for forming a channel region between the source and the drain, and a second gate formed in a region between the source and the drain for forming a channel region between the source and the drain, and overlapping at least partially with the first gate in a plan view. The second gate has geometry defined by a group of straight lines along geometry of the first gate, and providing a gate length discontinuously changing at least in one position along the gate length. The logic circuit further includes a signal input node connected to the first gate of each of the first and second field-effect transistors, a signal output node connected to connection nodes of the first and second field-effect transistors, and a control input node for controlling voltages applied to the second gates of the first and second field-effect transistors.

A logic circuit according to the invention includes first and second field-effect transistors connected in series between nodes supplying first and second voltages, and having a first conductivity type and a conductivity type opposite to the first conductivity type, respectively. Each of the first and second field-effect transistors includes a source, a drain, a rectangular first gate for forming a channel region between the source and the drain, and a second gate for forming a channel region between the source and the drain. The second gate has geometry defined by a group of straight lines along the geometry of the first gate, and having a gate length partially variable depending on a position along the gate width. The second gate is formed in a region between the source and the drain, and overlaps at least partially with the first gate in a plan view. The logic circuit further includes a signal input node connected to a first gate of each of the first and second field-effect transistors, a signal output node connected to connection nodes of the first and second field-effect transistors, and a control input node for controlling voltages applied to the second gates of the first and second field-effect transistors.

Preferably, the control input node applies a common voltage to the second gates of the first and second field-effect transistors.

Preferably, the control input node applies different voltages to the second gates of the first and second field-effect transistors, respectively.

The semiconductor element according to the invention can modulate a gain coefficient β in an analog manner with high accuracy in accordance with a voltage applied to the second gate (control gate), which is provided in addition to the ordinary first gate. Further, the semiconductor element can be produced easily by conventional process techniques, and thereby can be incorporated into various kinds of conventional LSIs formed of MOS circuits. Therefore, it is possible to achieve on-chip mechanisms, which can correct variations in characteristics by automatically modulating or adjusting element parameters, in various kinds of semiconductor integrated circuits.

In particular, not only the first gate but also the second gate (control gate) has the geometry defined only by a group of straight lines each extending in one of perpendicular directions. Therefore, it is possible to reduce variations in characteristics during fabrication, which may be caused by processing for oblique lines during subminiature processing of the semiconductor devices, so that a fabrication efficiency can be improved. In other words, a portion defined by an oblique line is eliminated from the from of the control gate so that fabricating quality of the semiconductor elements can be stable, and increase in fabrication cost can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the invention will now be described with reference to the drawings.

First Embodiment

Figure 1:
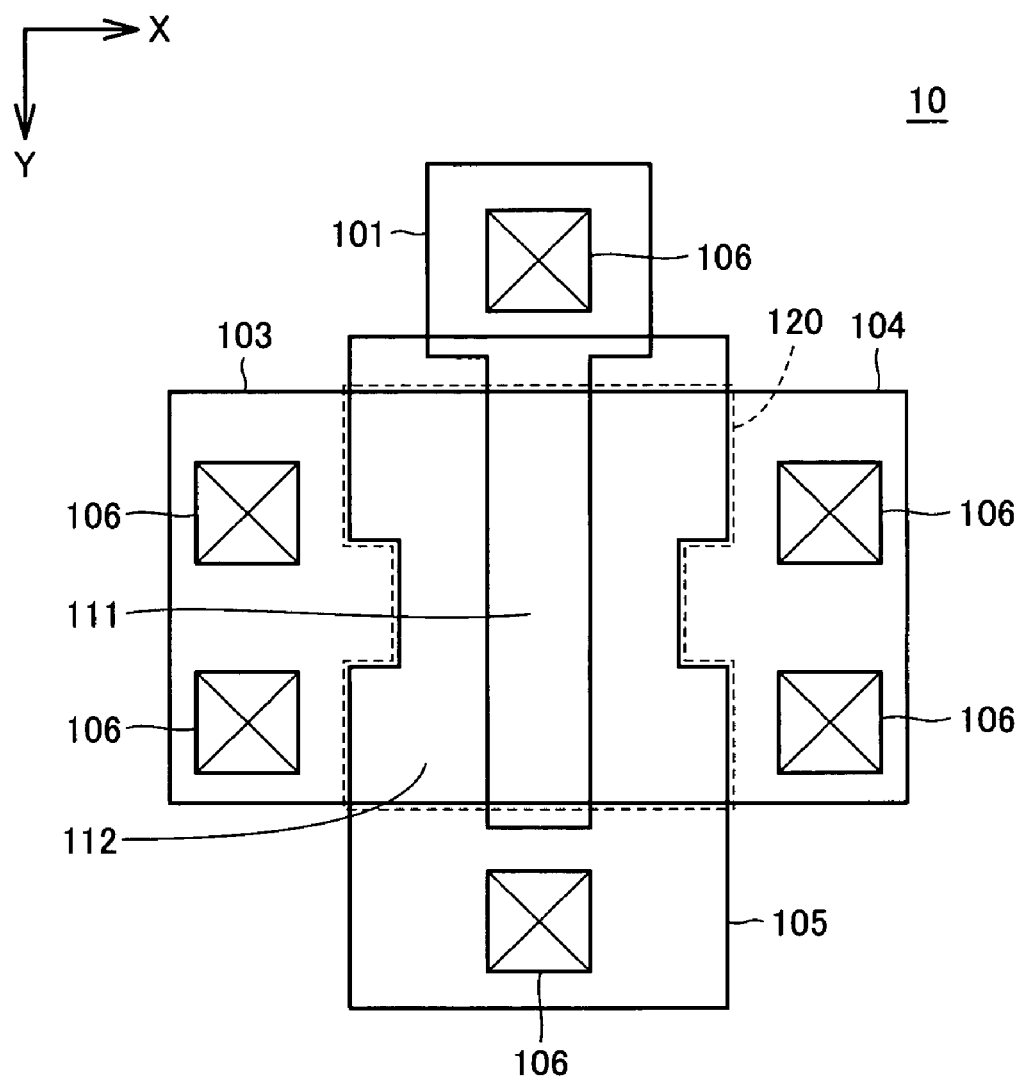
FIG. 1 shows a planar layout of a semiconductor element according to a first embodiment of the invention.
Figure 2:
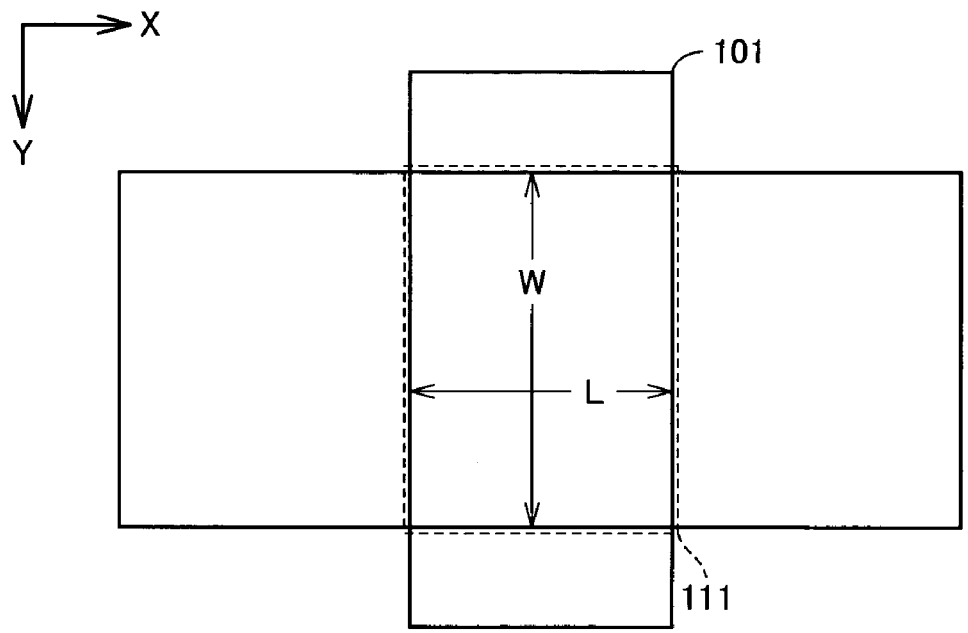
FIG. 2 illustrates geometrical parameters of an ordinary gate in FIG. 1.
Figure 3:
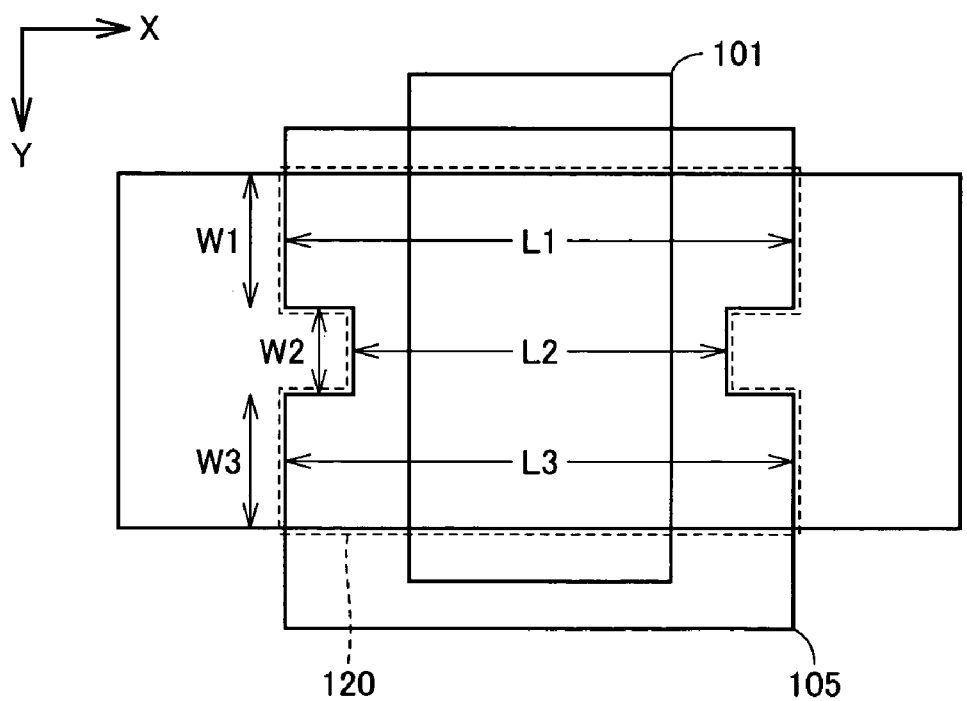
FIG. 3 illustrates geometrical parameters of a control gate in FIG. 1.

FIGS. 1 to 3 show a planar layout of a semiconductor element according to a first embodiment of the invention.

Referring to FIG. 1, a semiconductor element 10 according to a first embodiment includes an ordinary MOS gate 101, which will be merely referred to as a "MOS gate" hereinafter, a drain 103, a source 104 and a control gate 105, which is additionally employed according to the invention. MOS gate 101, drain 103, source 104 and control gate 105 are provided with contacts 106 for leading electrodes. Between drain 103 and source 104, MOS gate 101 forms a channel region 111, and control gate 105 forms a channel region 112. MOS gate 101 and control gate 105 are arranged such that channel regions 111 and 112 may have geometrical continuity.

In the following description, a direction along a gate length and a direction along a gate width of rectangular MOS gate 101 will be referred to as an X-direction and a Y-direction, respectively. Thus, MOS gate 101 has planar geometry defined only by a group of straight lines each extending in the X- or Y-direction, and thus in one of perpendicular directions. As shown in FIG. 2, the planar geometry for MOS gate 101 is expressed with a gate length L and a gate width W used as geometrical parameters.

In the semiconductor element according to the invention, control gate 105 likewise has planar geometry defined only by a group of straight lines along X- or Y directions. Further, control gate 105 has a nonuniform gate width, and has such geometry that discontinuity in gate length occurs at least in a portion as a position changes in the direction (Y-direction) of gate width. Further, control gate 105 has a portion, which is located between drain 103 and source 104, and overlaps at least partially with MOS gate 101 in a plan view.

For example, semiconductor element 10 according to the first embodiment has I-shaped planar geometry so that the channel length may have two different values. I-shaped control gate 105 located between drain 103 and source 104 covers MOS gate 101 having a rectangular form in a plan view. As shown in FIG. 3, the I-shaped geometry of control gate 105 is expressed with local gate widths W1, W2 and W3 as well as local gate lengths L1, L2 and L3 (L1=L3 in the first embodiment), which are geometrical parameters, respectively.

Figure 4:
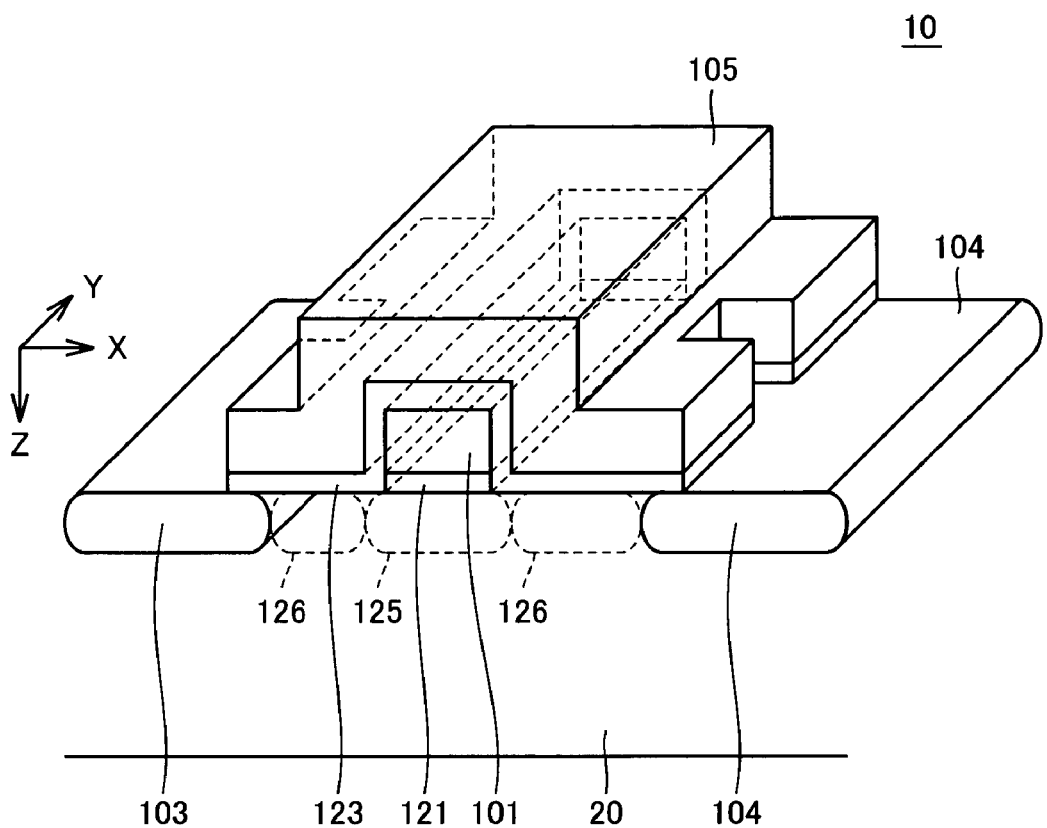
FIG. 4 is a perspective view showing a section of the semiconductor element shown in FIG. 1.

FIG. 4 is a perspective view showing a section of semiconductor element 10 shown in FIG. 1.

Referring to FIG. 4, a semiconductor substrate 20 (i.e., a p-type substrate if an n-type semiconductor element is to be formed) is doped with impurities (i.e., n-type impurities for the n-type semiconductor element) to form a region for forming drain 103 and source 104. Further, an electrically conductive gate layer forming MOS gate 101 is formed immediately above a region between drain 103 and source 104 with an insulating film 121 therebetween. Usually, the gate layer is formed of polycrystalline silicon or the like. Further, an insulating film 123 is formed above MOS gate 101, and a gate layer forming control gate 105 is formed above insulating film 123. Control gate 105 can be laid over MOS gate 101 by using a gate layer other than MOS gate 101.

Since insulating film 123 electrically isolates MOS gate 101 and control gate 105 from each other as described above, the voltage applied to MOS gate 101 and the voltage applied to control gate 105 can be controlled independently of each other.

Control gate 105 can be prepared by forming insulating film 123 and a conductive film on MOS gate 101, which is formed by the conventional fabrication process of MOS transistors. Thus, the fabrication process of the semiconductor element according to the invention can be the same as those for forming conventional MOS transistors except for that the process additionally includes steps of forming insulating film 123 for electrically isolating control gate 105 from MOS gate 101. These added steps may be similar to those for forming MOS gate 101 and insulating film 121 except for that mask patterns for control gate 105 and insulating film 123 must be modified in accordance with intended configurations. Thus, the semiconductor element according to the invention can be incorporated into an integrated circuit without significantly changing the fabrication process.

A region 126 under control gate 105 may be configured to have the same characteristics as a region 125 under MOS gate 101, or to have impurity concentration (of p-type impurities for the n-type semiconductor element) different from region 125.

In the structural example shown in FIG. 4, control gate 105 is formed above MOS gate 101. In principle, however, this relationship may be inverted to locate control gate 105 under MOS gate 101.

Figure 5:
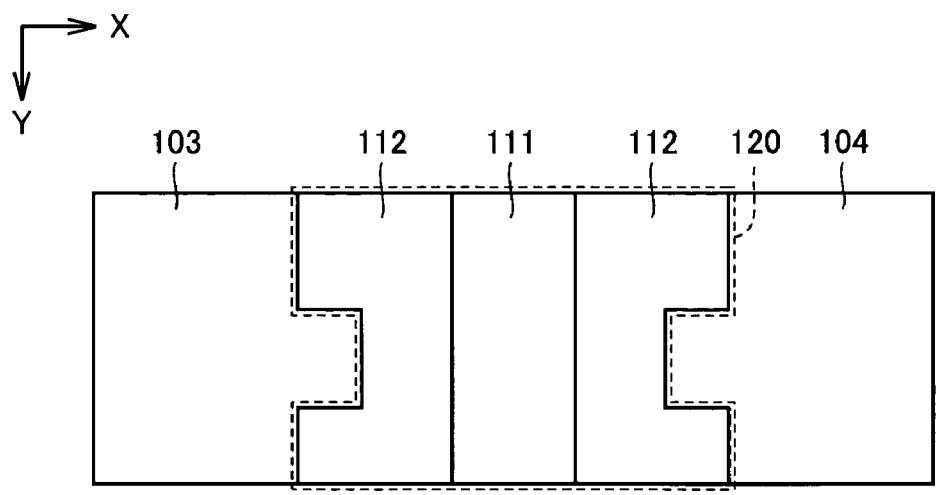
FIG. 5 is a plan illustrating a channel region formed in the semiconductor element shown in FIG. 1.

FIG. 5 is a plan illustrating channel regions formed at the semiconductor element shown in FIG. 1.

In semiconductor element 10 according to the first embodiment, as shown in FIG. 5, control channel region 112 under control gate 105 has a substantially concave portion located between MOS gate 101 and each of drain 103 and source 104. A combination of channel region 111 provided by MOS gate 101 and channel region 112 provided by control gate 105 provides a whole channel region 120 substantially having I-shaped geometry.

Description will now be given on modulation of gain coefficient β in semiconductor element 10.

Figure 6:
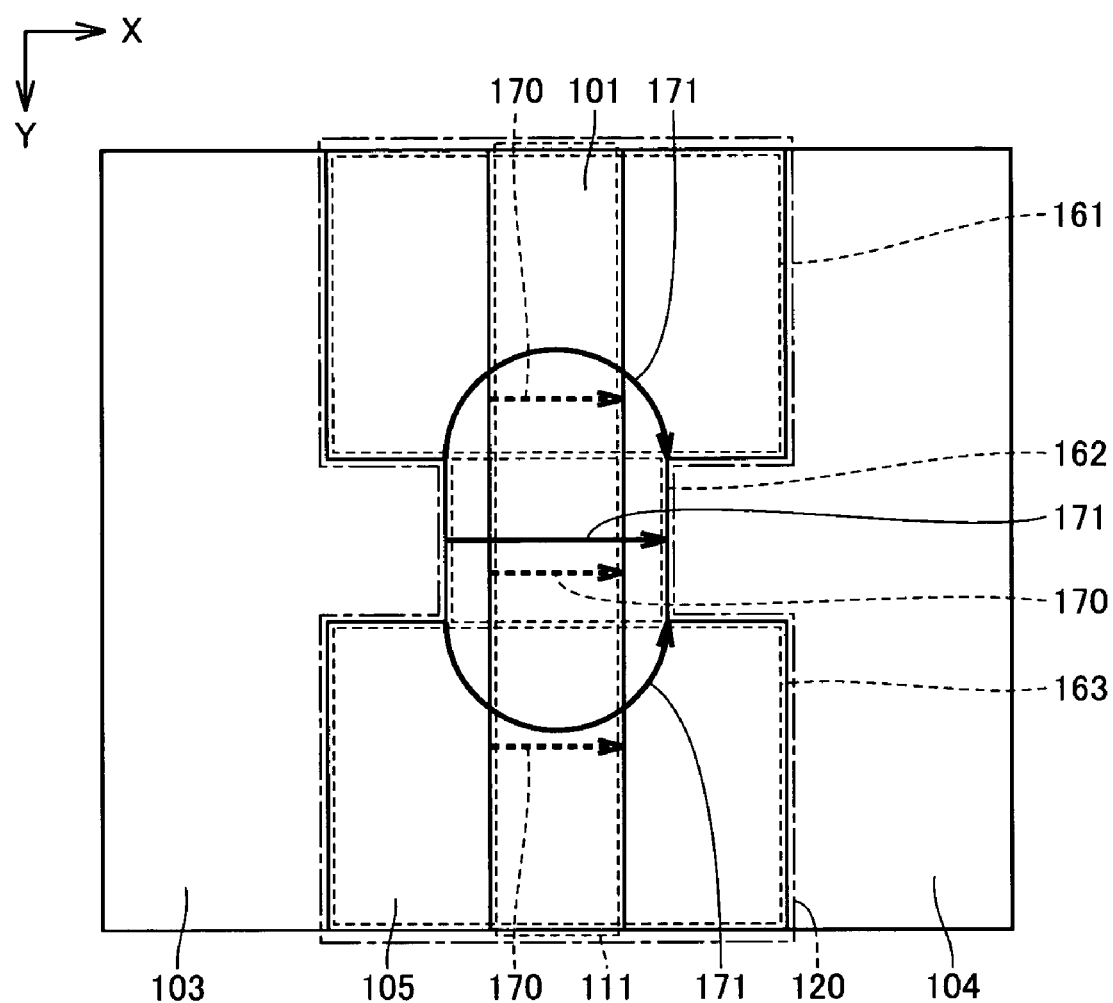
FIG. 6 conceptually shows a relationship between a control gate voltage and an electric field occurring in a channel region of the semiconductor element shown in FIG. 1.

FIG. 6 illustrates a concept of a relationship between an electric field occurring in the channel regions of semiconductor element and the control gate voltage.

In the semiconductor device according to the invention, since MOS gate 101 and control gate 105 are both present, the electric field occurring in whole channel region 120 changes depending on the channel conductance under control gate 105. Thus, the electric field changes, in the strict sense, depending on a ratio between voltages, which are applied to control gate 105 and MOS gate 101, and will be referred to as a "control gate voltage Vgc" and a "MOS gate voltage", respectively, and changes substantially depending on the control gate voltage.

When a channel conductance under control gate 105 is sufficiently high, electric field vectors occurring in whole channel region 120 are uniform in the X direction, as indicated by dotted lines 170 in FIG. 6. Consequently, the channel width and the channel length of whole channel region 120 become equivalent to gate length L and gate width W of MOS gate 101, respectively.

Conversely, when the channel conductance under control gate 105 is sufficiently low, the electric field vectors occurring in whole channel region 120 become irregular in regions 161, 162 and 163, which are divided in accordance with nonuniformity in gate length, such that the electric field vectors in regions 161 and 162 may differ from those in region 163, as indicated by solid lines 171. More specifically, in region 162 having a relatively short gate length, the electric field vectors occur in the X-direction similarly to those indicated by dotted lines 170. In regions 161 and 163 having a relatively large gate length, however, wraparound of the electric fields occurs due to partial or local changes in electric fields.

Figure 7:
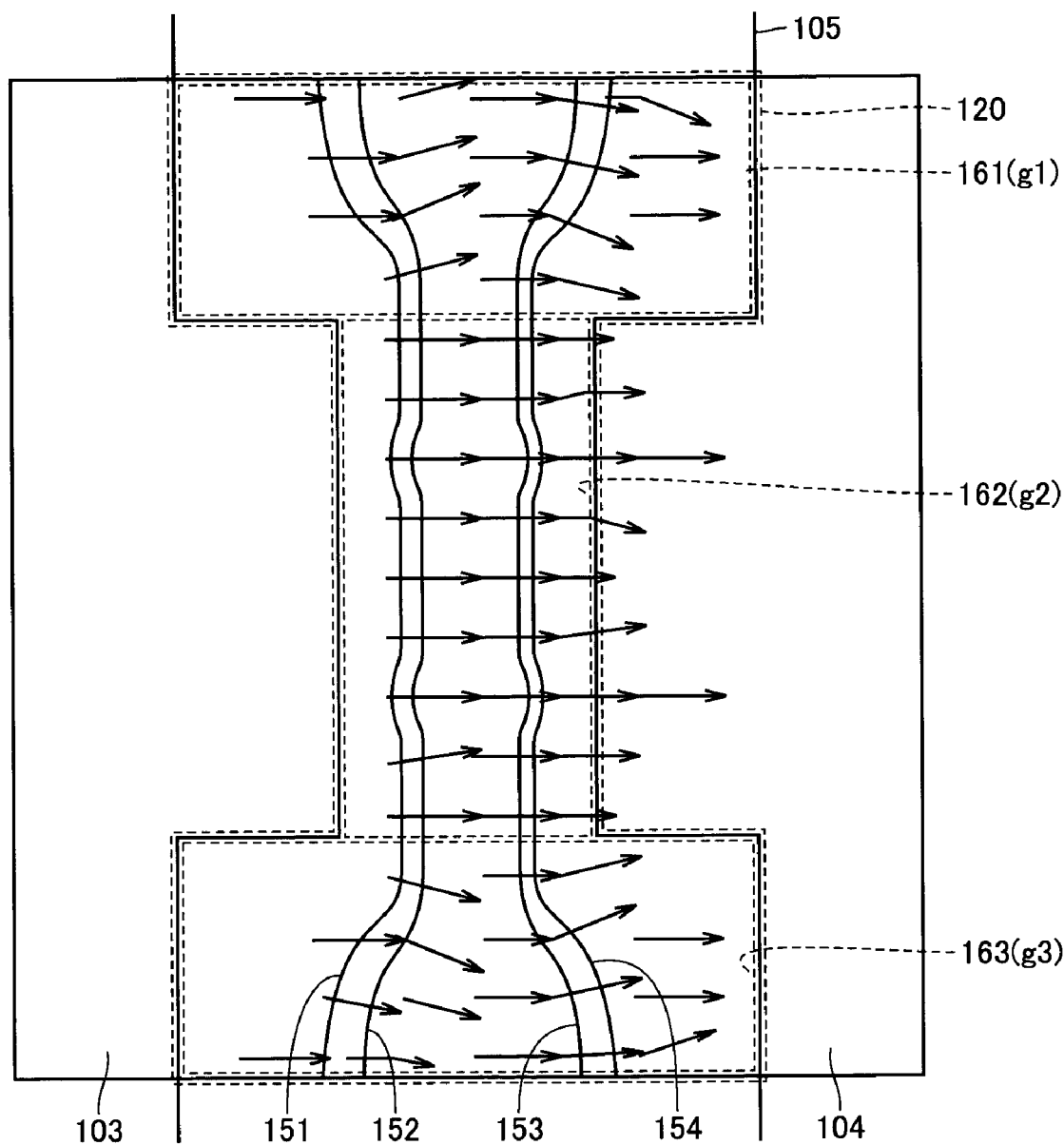
FIG. 7 specifically illustrates an electric field occurring in the channel region of the semiconductor element when a channel conductance under the control gate is low.

FIG. 7 specifically illustrates electric fields, which occur when the channel conductance under the control gate is sufficiently low.

FIG. 7 shows results of simulation of equipotential lines 151, 152, 153 and 154 as well as the electric field vectors (arrows in FIG. 7), which occur when the channel conductance under the control gate is sufficiently low and a predetermined voltage is applied across the source and drain.

In regions 161 and 163, the electric fields caused in the X direction by the source-drain voltages are not uniform, and the wraparound occurs corresponding to the geometry of control gate 105. This corresponds to the directions of the electric fields on electrode ends of a parallel-plate capacitor, which can be considered as being formed between drain 103 and source 104 in region 162 having a short gate length.

In regions 161 and 163 corresponding to ends of the capacitor, the gate length is relatively long so that the electric field in region 162 having a relatively short gate length is larger than those in regions 161 and 163. Thus, region 162 of relatively strong electric fields and regions 161 and 163 of relatively weak electric fields provide nonuniform electric fields in whole channel region 120. In other words, the semiconductor element according to the invention has control gate 105 of the geometry designed such that the foregoing effect by the ends causes partial or local changes in electric field to provide the nonuniform electric fields in whole channel region 120. In this manner, control gate 105 is designed to have a partially different (nonuniform) gate length so that the channel resistance may partially change to cause a difference in intensity of the electric fields in the channel region.

As a result, weak electric field regions 161 and 163 have conductances g1 and g3 relatively smaller than a conductance g2 of strong electric field region 162. The conductance of channel region 112 is equal to a sum of conductances g1, g2 and g3 of regions 161, 162 and 163, which are connected in parallel. In this case, therefore, the conductance of whole channel region 120 is smaller than that in the case where uniform electric fields are formed throughout the region, i.e., in the case the channel conductance under the control gate is sufficiently high.

In this case, the conductance of whole channel region 120, i.e., the gain coefficient of the semiconductor element takes the minimum value βmin. In this case, a ratio of Wgc/Lgc between effective gate length Lgc and gate width Wgc of whole channel region 120 is smaller than a ratio (W/L) of the gate length and gate width of MOS gate 101. Thus, the effective gate length and gate width of whole channel region 120 is modulated due to the electric field difference occurring in the channel region. According to the n-type semiconductor element (MOS transistor) of the invention, the conductance of channel region 112 lowers with decrease in control gate voltage Vgc. Conversely, according to the p-type semiconductor element (MOS transistor) of the invention, the conductance of channel region 112 lowers with increase in control gate voltage Vgc.

As already described with reference to FIG. 6, when the channel conductance is sufficiently high, whole channel region 120 provides a region of uniform and strong electric fields, and the conductance of whole channel region 120, i.e., the gain coefficient of the semiconductor element takes the maximum value of βmax. As described above, the electric field (maximum wraparound) corresponding to minimum gain coefficient βmin indicated by dotted lines 170 in FIG. 6, the electric field (uniform in the X-direction) corresponding to maximum gain coefficient βmax indicated by solid line 171 in FIG. 6, or electric fields intermediate between these electric fields occur in whole channel region 120 in accordance with the ratio between the MOS gate voltage and the control gate voltage. In particular, the intermediate electric field changes in an analog manner in accordance with the ratio between the MOS gate voltage and the control gate voltage.

From the above description, gain coefficient β of the semiconductor element according to the first embodiment can be modulated within a range expressed by the following formulas (1)–(3) in accordance with control gate voltage Vgc.

$$\beta min \leq \beta \leq \beta max \quad (1)$$

$$\beta min = (Wgc/Lgc) \cdot \mu \cdot Cox \quad (2)$$

$$\beta max = (W/L) \cdot \mu \cdot Cox \quad (3)$$

where μ represents a mobility, and Cox represents a capacitance of a gate insulating film per unit area.

As described above, minimum gain coefficient βmin is expressed with the effective gate length Lgc and gate width Wgc. As illustrated in FIG. 7, the changes in effective gate length and gate width are caused by the geometry of control gate 105 having nonuniform gate length. Therefore, minimum gain coefficient βmin is determined by geometrical parameters W1, W2, W3, L1, L2 and L3 shown in FIG. 3. Maximum gain coefficient βmax is determined by the gate length and gate width of MOS gate 101, i.e., geometrical parameters L and W shown in FIG. 2.

The level of gain coefficient β in the above range depends on the ratio between the voltages applied to MOS gate 101 and control gate 105, respectively. Under the conditions that the MOS gate voltage is fixed in turned-on semiconductor element 10, gain coefficient β is modulated substantially in accordance with control gate voltage Vgc.

In the semiconductor element according to the first embodiment of the invention, as described above, the electric field distribution over whole channel region 120 changes in an analog manner in accordance with the voltage applied to control gate 105 having the geometry, which allows formation of nonuniform electric fields in the channel region, and thereby gain coefficient β can be modulated. Further, the geometry of control gate 105 is defined only by a group of straight and perpendicular lines each extending in the X- or Y-direction, and does not have a portion defined by an oblique line so that control gate 105 can be fabricated with high accuracy. Consequently, it is possible to suppress variations in characteristics during production of the semiconductor elements.

Such a design may be employed that insulating film 121 (FIG. 4) under MOS gate 101 has a thickness different from that of insulating film 123 (FIG. 4) under control gate 105. In this case, minimum gain coefficient βmin and maximum gain coefficient βmax are different from those expressed by the foregoing formulas (2) and (3), but gain coefficient β can be modulated in accordance with control gate voltage Vgc.

As described above, gain coefficient β of the semiconductor element according to the invention can be modulated within a range, which is basically determined by the geometry of MOS gate 101 and control gate 105, and further, the modulation range and, in other words, minimum and maximum gain coefficients βmin and βmax can be controlled in accordance with the design of the film thickness of the gate insulating film already described. Alternatively, the modulation range can also be controlled in accordance with impurity concentrations of region 125 under MOS gate 101 and region 126 under control gate 105 shown in FIG. 4.

Figure 8:
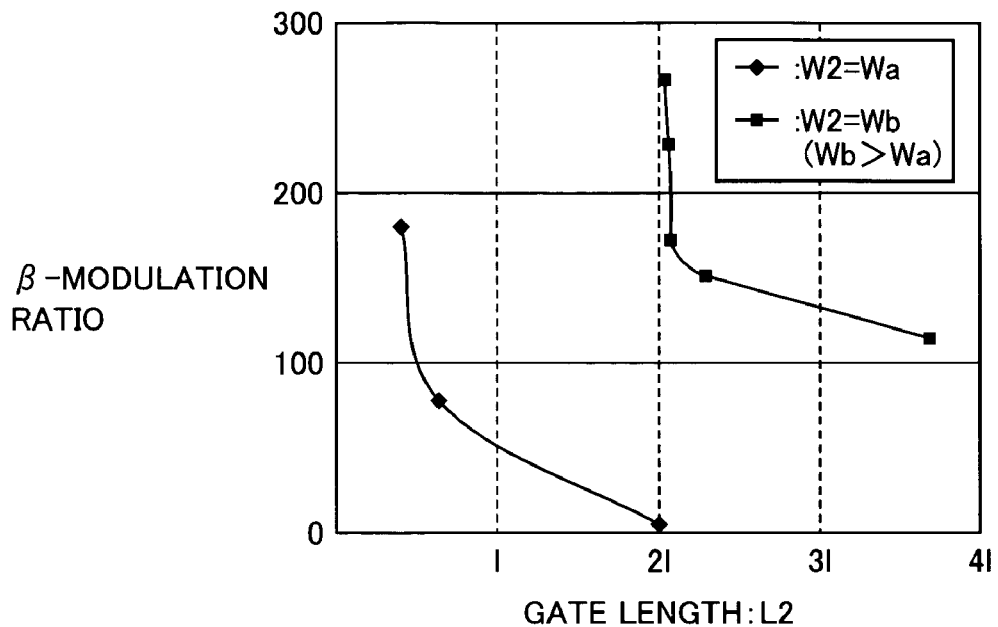
FIG. 8 illustrates results of trial semiconductor elements according to the first embodiment.

FIG. 8 illustrates results of trial semiconductor elements according to the first embodiment. FIG. 8 illustrates actual results relating to the β-modulation ratio in eight kinds of semiconductor elements according to the invention, which were prepared in such a manner that the sizes (gate length L and gate width W shown in FIG. 3) of MOS gate 101 as well as a sum total of gate widths (W1, W2 and W3 shown in FIG. 3) of control gate 105 and gate lengths (L1 and L3 in FIG. 3) of the end regions were fixed, and geometrical parameters L2 and W2 in FIG. 3 of the central portion of control gate 105 were changed.

The abscissa in FIG. 8 gives geometrical parameter L2, and the ordinate gives the β-modulation ratio, i.e., an actual value of βmax/βmin in formula (1). According to the semiconductor element of the first embodiment, as illustrated in FIG. 8, gain coefficient β can be substantially modulated to increase several to about 300 times in accordance with the voltage applied to control gate 105. The achieved modulation ratio can be designed in accordance with the geometry of control gate 105.

In the range illustrated in FIG. 8, the β-modulation ratio increases with decrease in geometrical parameter L2 and with increase in geometrical parameter W2. Thus, it can be confirmed from the results of trial that the intended β-modulation ratio is achieved by configuring the geometry of control gate 105 such that a remarkable difference occurs in electric field between the strong and weak electric field regions already described with reference to FIG. 7.

Second Embodiment

Figure 9:
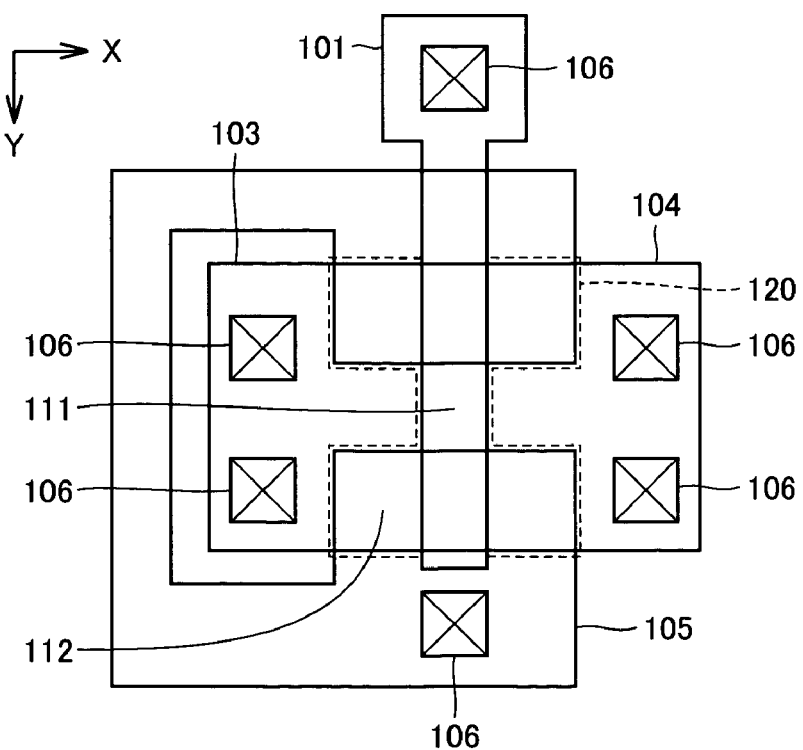
FIG. 9 shows a planar layout of a semiconductor element according to a second embodiment of the invention.

FIG. 9 shows a planar layout of a semiconductor element according to a second embodiment.

Referring to FIG. 9, a semiconductor element 11 according to the second embodiment has MOS gate 101, drain 103, source 104, control gate 105 and contacts 106, similarly to semiconductor element 10 of the first embodiment. Semiconductor element 11 according to the second embodiment differs from semiconductor element 10 only in the geometry of control gate 105. Therefore, the fabrication process and fabricating conditions of semiconductor element 11 can be similar to those of semiconductor element 10 according to the first embodiment.

Control gate 105 has such planar geometry that interrupts in a central portion of a region overlapping with ordinary gate 101 in a plan view, and is present in other portions. Thus, the gate length of control gate 105 is different between the central portion (interrupting portion) and the other portions. In semiconductor element 12, control gate 105 has planar geometry defined only by a group of straight lines each extending in the X- or Y-direction, and is formed in a portion of the region overlapping with ordinary gate 101 in a plan view, similarly to MOS gate 101.

In semiconductor element 11, channel region 111 provided by MOS gate 101 geometrically continues to channel region 112 provided by control gate 105, and whole channel region 120 formed of both regions 111 and 112 has I-shaped geometry. In semiconductor element 11, when the channel conductance under control gate 105 is low, a region of strong electric fields occurs corresponding to the interrupting portion of control gate 105, and a region of weak electric fields occurs corresponding to a portion provided with control gate 105. Therefore, it is possible to modulate gain coefficient β in semiconductor element 11 of the second embodiment by a mechanism similar to that of semiconductor element 10 of the first embodiment.

Particularly, in the semiconductor element of the second embodiment, the region of strong electric fields corresponding to the interrupting portion of control gate 105 is configured such that the electric field occurring in the channel region is completely independent of the channel conductance of the control gate. Therefore, it is possible to increase the end effect at end regions 161 and 163 already described with reference to FIG. 7, and thereby to make local changes (wraparound) of the electric fields, which occur in the region of weak electric fields, more remarkable. Consequently, when the channel conductance of the control gate is sufficiently low, conductances g1 and g3 of end regions 161 and 163 are much lower than those in the first embodiment. Therefore, the ratio (Wgc/Lgc) between the effective gate length and gate width can be small, and minimum gain coefficient βmin expressed by formula (2) lowers so that the β-modulation ratio larger than that in the semiconductor element of the first embodiment can be ensured.

Particularly, in the semiconductor element of the second embodiment, the gate length of the portion, which has the shortest gate length, of whole channel region 120 can be equal to the minimum process value in the gate fabrication process. This likewise ensures a large β-modulation ratio in the semiconductor element of the second embodiment.

Third Embodiment

Figure 10:
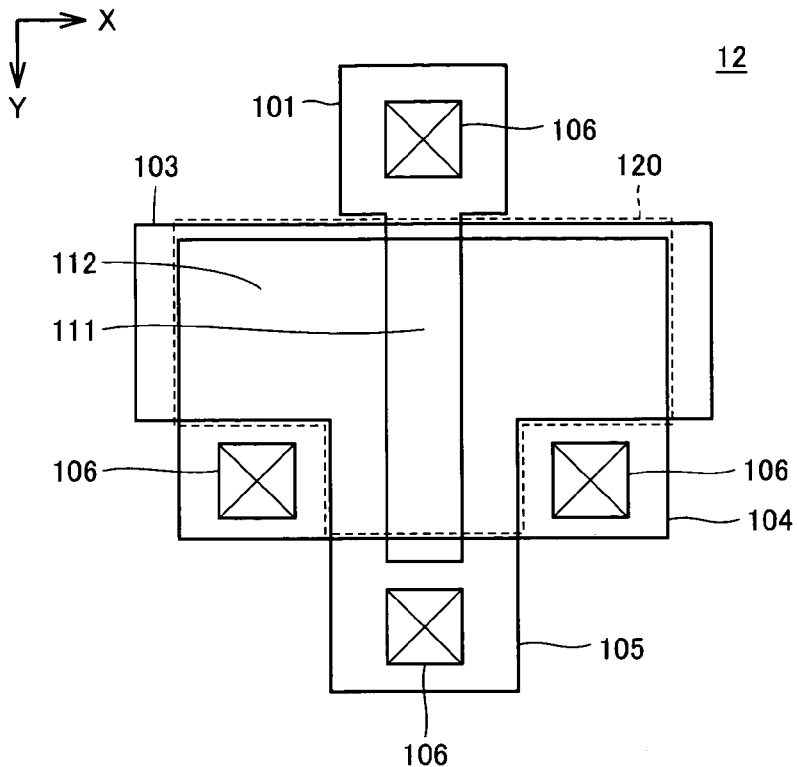
FIG. 10 shows a planar layout of a semiconductor element according to a third embodiment.

FIG. 10 shows a planar layout of a semiconductor element according to a third embodiment of the invention.

Referring to FIG. 10, a semiconductor element 12 according to the third embodiment has MOS gate 101, drain 103, source 104, control gate 105 and contacts 106, similarly to semiconductor element 10 of the first embodiment. Semiconductor element 12 according to the third embodiment differs from semiconductor element 10 only in the geometry of control gate 105. Therefore, the fabrication process and fabricating conditions of semiconductor element 12 can be similar to those of semiconductor element 10 of the first embodiment.

In semiconductor element 12 of the third embodiment, control gate 105 has T-shaped geometry in a plan view. T-shaped control gate 105 is located in a region between drain 103 and source 104, and covers rectangular MOS gate 101 in a plan view. In semiconductor element 12, control gate 105 has planar geometry defined only by a group of straight lines each extending in the X- or Y-direction, and locally has a different gate length, similarly to MOS gate 101.

Channel region 111 provided by MOS gate 101 geometrically continues to channel region 112 provided by control gate 105, and whole channel region 120 formed of a combination of these regions 111 and 112 substantially has T-shaped geometry. When the channel conductance under control gate 105 is low, a region of strong electric fields occurs corresponding to the portion of the short gate length, and a region of weak electric fields occurs corresponding to the portion of the long gate length. In semiconductor element 12 of the third embodiment, therefore, gain coefficient β can be modulated by a mechanism similar to that of semiconductor element 10 according to the first embodiment.

In semiconductor element 12, minimum gain coefficient βmin is likewise determined depending on a difference in electric field between the strong and weak electric field regions, which is caused by the difference between relative gate lengths in control gate 105. In the T-shaped geometry, therefore, the β-modulation ratio may be smaller than that of the I-shaped geometry already described. However, the semiconductor element of the third embodiment is effective in structures having relatively small gate widths, and allows processing or working to ensure intended widths of source and drain regions in relatively narrow regions. Spaces for the contacts arranged in the source and drain regions can be easily ensured.

Fourth Embodiment

Figure 11:
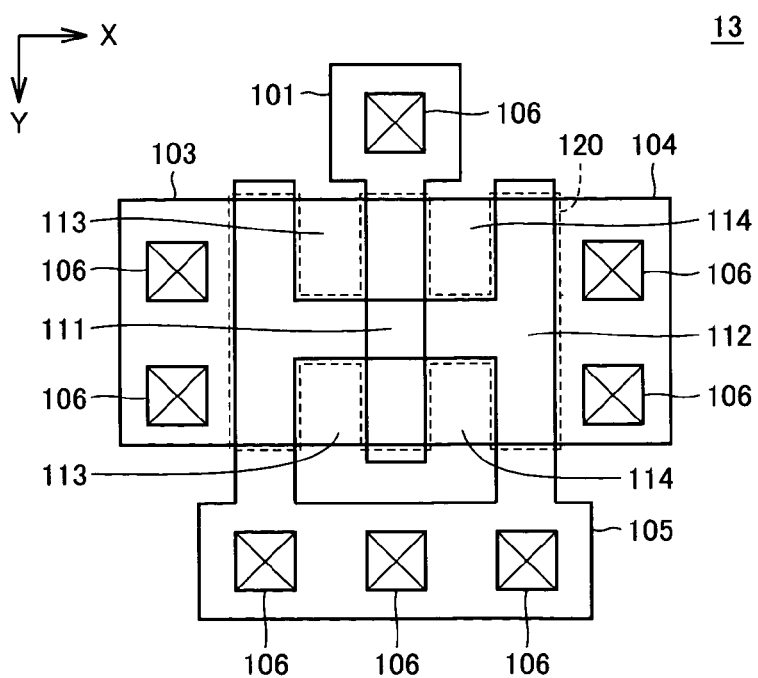
FIG. 11 shows a planar layout of a semiconductor element according to a fourth embodiment.

FIG. 11 shows a planar layout of a semiconductor element according to a fourth embodiment of the invention.

Referring to FIG. 11, a semiconductor element 13 according to the fourth embodiment has MOS gate 101, drain 103, source 104, control gate 105 and contacts 106, similarly to semiconductor element 10 of the first embodiment. Semiconductor element 13 according to the fourth embodiment differs from semiconductor element 10 only in the geometry of control gate 105. Therefore, the fabrication process and fabricating conditions of semiconductor element 13 can be similar to those of semiconductor element 10 of the first embodiment.

Control gate 105 has a bridge-like portion, which extends in the X-direction only through a central portion of a region overlapping with ordinary MOS gate 101 in a plan view, and is not formed in other portions of the overlapping region. Thus, in control gate 105, the gate length of the central portion (bridge-like portion) is different from that of the other portion. In semiconductor element 13, control gate 105 has planar geometry defined only by a group of straight lines each extending in the X- or Y-direction, similarly to MOS gate 101, and is formed in a portion of the region overlapping with ordinary gate 101 in a plan view.

Consequently, channel region 111 provided by ordinary MOS gate 101 geometrically continues to channel region 112 provided by control gate 105, and whole channel region 120 formed of a combination of these regions 111 and 112 has geometry, which can be defined by removing a floating drain 113 and a floating source 114 corresponding to portions, which are not provided with control gate 105, from a rectangular form. In semiconductor element 13, when the channel conductance under control gate 105 is low, a region of strong electric fields occurs corresponding to the portion not provided with control gate 105 under MOS gate 101, and a region of weak electric fields occurs corresponding to the bridge-like portion provided with control gate 105. In semiconductor element 13 according to the fourth embodiment, therefore, gain coefficient β can be modulated by a mechanism similar to that of semiconductor element 10 of the first embodiment.

By providing control gate 105 having the geometry according to the fourth embodiment, it is possible to cause more remarkably the wraparound of electric fields in the weak electric field regions, and the effective gate length can be long so that minimum gain coefficient βmin expressed by the formula (2) can be further lowered, and the modulation range of gain coefficient β can be further increased.

In particular, according to the geometry of control gate 105, the wraparound of electric fields in the weak electric field regions can occur more remarkably with decrease in width of the bridge-like portion, and thereby the effective gate length can be increased. The width of the bridge-like portion can be minimized to the minimum line width allowed in the semiconductor element fabrication process. Therefore, the accuracy achieved by the leading-edge microfabrication technique in the semiconductor element fabrication can be directly used for ensuring the β-modulation ratio.

Fifth Embodiment

In a fifth embodiment, a CMOS inverter circuit (NOT circuit) will be described as a typical example of a logical circuit provided with a semiconductor element according to the invention.

Figure 12A:
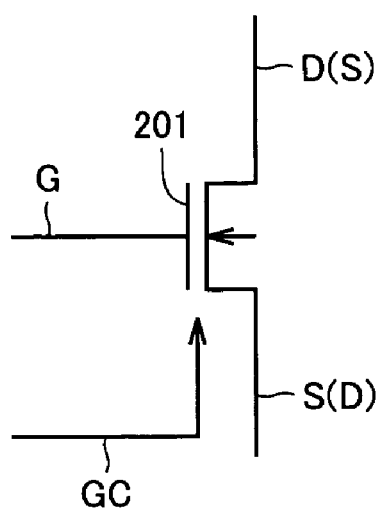
FIGS. 12A and 12B are diagrams showing in symbol the semiconductor element according to the invention.
Figure 12B:
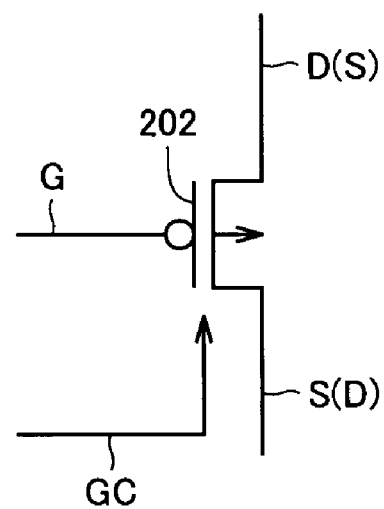

FIGS. 12A and 12B are diagrams showing in symbol the semiconductor element according to the invention.

FIG. 12A shows an n-channel MOS transistor 201, which will be referred to as a "n-MOS transistor" hereinafter, according to the invention, and FIG. 12B shows a p-channel MOS transistor 202, which will be referred to as a "p-MOS transistor" hereinafter, according to the invention. n- and p-MOS transistors 201 and 202 employ the semiconductor elements of any one of the first to fourth embodiments already described, and each include a control gate GC in addition to ordinary source S, drain D and gate G.

Figure 13:
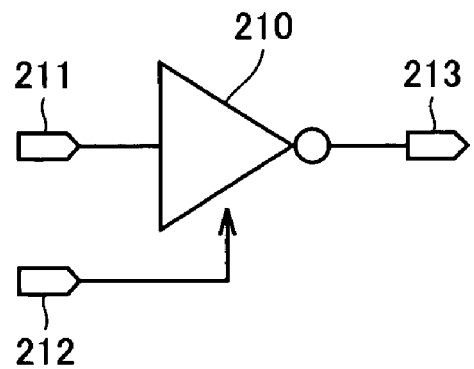
FIG. 13 is a diagram showing in symbol a CMOS inverter circuit, which is a typical example of a logic circuit employing the semiconductor element according to the invention.

FIG. 13 is a diagram showing in symbol a CMOS inverter circuit, which is a typical example of the logic circuit employing the semiconductor element according to the invention.

Referring to FIG. 13, a CMOS inverter circuit 210 inverts a logical level of a signal input node 211 for output to a signal output node 213. Inverter circuit 210 also receives a voltage applied to a control input node 212.

Figure 14:
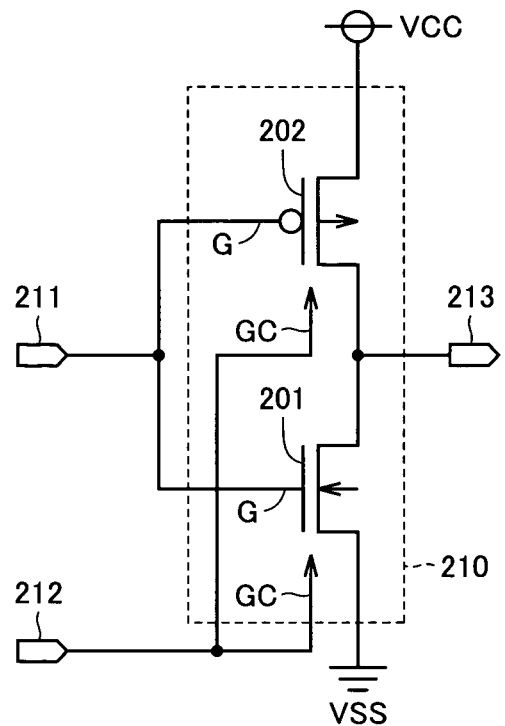
FIG. 14 is a circuit diagram showing a first structural example of the CMOS inverter circuit shown in FIG. 13.

FIG. 14 is a circuit diagram showing a first structural example of the CMOS inverter circuit shown in FIG. 13.

Referring to FIG. 14, CMOS inverter circuit 210 includes n- and p-MOS transistors 201 and 202, which are connected in series between a supply node of a power supply voltage VCC corresponding to a logical high level and a supply node of a voltage VSS corresponding to a logical low level. A source of p-MOS transistor 202 is connected to the supply node of power supply voltage VCC, and a drain thereof is connected to signal output node 213. Likewise, a source of n-MOS transistor 201 is connected to a supply node of voltage VSS, and a drain thereof is connected to signal output node 213.

Gates G of n- and p-MOS transistors 201 and 202 are commonly connected to signal input node 211, and control gates GC thereof are commonly connected to control input node 212. As already described in connection with the first to fourth embodiments, gain coefficients β of n- and p-MOS transistors 201 and 202 are modulated in accordance with the voltage on control input node 212.

By connecting control gates GC of n- and p-MOS transistors 201 and 202 to common control-input node 212 as described above, a ratio between current drivability of n- and p-MOS transistors 201 and 202, i.e., a p/n ratio can be modulated in accordance with the voltage on control input node 212, and thereby a threshold of CMOS inverter circuit 210 can be finely modulated.

Figure 15:
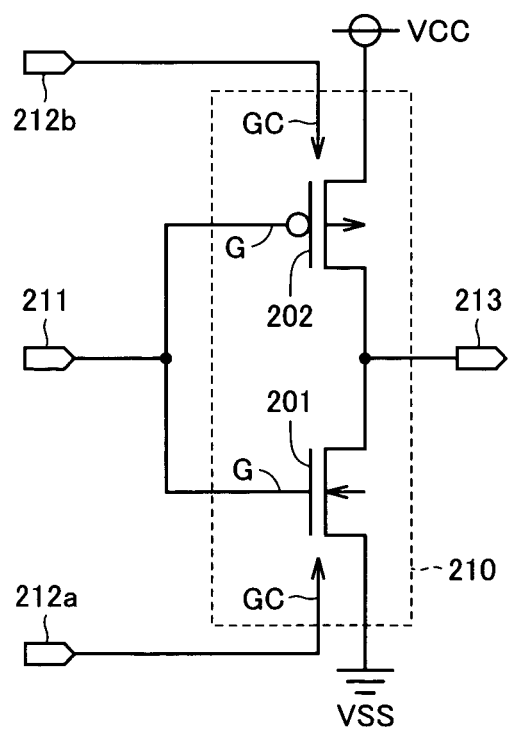
FIG. 15 is a circuit diagram showing a second structural example of the CMOS inverter circuit shown in FIG. 13.

FIG. 15 is a circuit diagram showing a second structural example of CMOS inverter circuit 210 shown in FIG. 13.

In the example shown in FIG. 15, each of n- and p-MOS transistors 201 and 202 forming CMOS inverter circuit 210 receives on its control gate GC a voltage, which is set independently of a voltage received by the other transistor. More specifically, control gate GC of n-MOS transistor 201 is connected to a control input node 212a, and control gate GC of p-MOS transistor 202 is connected to a control input node 212b. By this structure, gain coefficient β of each of n- and p-MOS transistors 201 and 202 can be controlled independently of the other for modulating the characteristics of inverter circuit 210.

As described above, n- and p-MOS transistors 201 and 202, which are the semiconductor elements of the invention, can be appropriately combined to apply them to logic circuits such as a CMOS inverter circuit. For such application, variations in characteristics caused by manufacturing of the MOS transistors can be cancelled by the control inputs, i.e., the voltages applied to the control gates. Therefore, it is possible to remove an influence by variations due to the manufacturing, and to fabricate easily the logical circuit having stable characteristics.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor element comprising:
a source and a drain;
a first gate for forming a channel region of a uniform electric field between said source and said drain; and
a second gate having a non-uniform gate width and a gate length that varies with a position along the gate width for forming a channel region of a non-uniform electric field formed of strong and weak electric field regions, wherein
said first and second gates are located between said source and said drain, and overlap each other at least partially in a plan view, and
a conductance of a whole channel region between said source and said drain changes as a conductance of said channel region provided by said second gate changes in accordance with a voltage applied to said second gate.

2. The semiconductor element according to claim 1, wherein
occurrence of said strong electric field region and said weak electric field region partially changes a direction of the electric field in the whole channel region formed by said first and second gates, and said change in electric field direction modulates the effective gate length and gate width in said whole channel region.

3. The semiconductor element according to claim 1, wherein
said first gate has a rectangular form, and
said second gate has a geometry defined by a group of straight lines extending along the geometry of said first gate.

4. The semiconductor element according to claim 1, wherein
a conductance of a whole channel region including channels formed by said first and second gates is controlled in accordance with voltages applied to said first and second gates.

5. The semiconductor element according to claim 1, wherein
an electric field vector in a whole channel region formed by said first and second gates is modulated in accordance with a ratio between voltages applied to said first and second gates, respectively.

6. The semiconductor element according to claim 1, wherein
said first and second gates are layered with an insulating layer interposed between said first and second gates for electrical isolation.

7. The semiconductor element according to claim 1, wherein
geometry of said first and second gates are designed such that the channel regions respectively formed by said first and second gates between said source and said drain have geometrical continuity.

8. The semiconductor element according to claim 1, wherein
in the region between said source and said drain, a first portion overlapping with said first gate in a plan view has an impurity concentration different from that of a second portion not including said first portion but overlapping with said second gate in a plan view.

9. The semiconductor element according to claim 1, wherein
in the region between said source and said drain, a first portion overlapping with said first gate in a plan view has an impurity concentration substantially equal to that of a second portion not including said first portion and overlapping with said second gate in a plan view.

10. A semiconductor element comprising:
a source and a drain;
a first gate having a rectangular form for forming a channel region between said source and said drain; and
a second gate for forming a channel region between said source and said drain, geometry of said second gate being defined by a group of straight lines along the geometry of said first gate, and having a non-uniform gate width and a gate length that varies with a position along the gate width, wherein
said second gate is formed in a region between said source and said drain, and overlaps at least partially with said first gate in a plan view.

11. The semiconductor element according to claim 10, wherein
said second gate in the region between said source and said drain covers said first gate in a plan view.

12. The semiconductor element according to claim 10, wherein
said second gate is configured to leave a portion of said first gate uncovered by said second gate within a region overlapping with said first gate in a plan view.

13. The semiconductor element according to claim 12, wherein
said second gate is not formed in a central portion, in a direction of a gate width, within the region overlapping with said first gate in a plan view, and is formed in a portion other than the central portion.

14. The semiconductor element according to claim 12, wherein
said second gate is formed in a central portion, in a direction of a gate width, within the region overlapping with said first gate in a plan view, and is not formed in a portion other than the central portion.

15. The semiconductor element according to claim 10, wherein
a conductance of a whole channel region formed by said first and second gates is controlled in accordance with voltages applied to said first and second gates.

16. The semiconductor element according to claim 10, wherein
an electric field vector in a whole channel region formed by said first and second gates is modulated in accordance with a ratio between voltages applied to said first and second gates, respectively.

17. The semiconductor element according to claim 10, wherein
said first and second gates are layered with an insulating layer interposed between said first and second gates for electrical isolation.

18. The semiconductor element according to claim 10, wherein
geometry of said first and second gates are designed such that the channel regions respectively formed by said first and second gates between said source and said drain have geometrical continuity.

19. The semiconductor element according to claim 10, wherein
in the region between said source and said drain, a first portion overlapping with said first gate in a plan view has an impurity concentration different from that of a second portion not including said first portion but overlapping with said second gate in a plan view.

20. The semiconductor element according to claim 10, wherein
in the region between said source and said drain, a first portion overlapping with said first gate in a plan view has an impurity concentration substantially equal to that of a second portion not including said first portion and overlapping with said second gate in a plan view.

* * * * *

UNITED STATES PATENT AND TRADEMARK OFFICE
CERTIFICATE OF CORRECTION

| | |
|---|---|
| PATENT NO. | : 7,057,239 B2 |
| APPLICATION NO. | : 10/769819 |
| DATED | : June 6, 2006 |
| INVENTOR(S) | : Fusayoshi Hirotsu et al. |

Page 1 of 1

It is certified that error appears in the above-identified patent and that said Letters Patent is hereby corrected as shown below:

Col. 13, claim 4, lines 34-35, delete "including channels."

Signed and Sealed this

Twenty-ninth Day of August, 2006

JON W. DUDAS
*Director of the United States Patent and Trademark Office*